(12) United States Patent
Chen et al.

(10) Patent No.: US 7,202,148 B2
(45) Date of Patent: Apr. 10, 2007

(54) METHOD UTILIZING COMPENSATION FEATURES IN SEMICONDUCTOR PROCESSING

(75) Inventors: Kuei Shun Chen, Hsin-Chu (TW);
Chin-Hsiang Lin, Hsinchu (TW);
Chih-Cheng Chiu, Xinzhung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 340 days.

(21) Appl. No.: 10/842,065

(22) Filed: May 10, 2004

(65) Prior Publication Data

US 2005/0250330 A1   Nov. 10, 2005

(51) Int. Cl.
*H01L 21/308* (2006.01)

(52) U.S. Cl. ............ 438/585; 438/694; 430/290; 430/316; 257/E21.177

(58) Field of Classification Search ......... 430/290, 430/316; 438/585, 694; 257/E21.177
See application file for complete search history.

(56) References Cited

U.S. PATENT DOCUMENTS

| | | | |
|---|---|---|---|
| 5,424,154 A * | 6/1995 | Borodovsky | 430/5 |
| 6,043,157 A * | 3/2000 | Gardner et al. | 438/692 |
| 6,445,047 B1* | 9/2002 | Yamada et al. | 257/391 |
| 6,492,097 B1 | 12/2002 | Chen et al. | |
| 6,509,225 B2* | 1/2003 | Moriwaki et al. | 438/241 |
| 6,541,166 B2* | 4/2003 | Mansfield et al. | 430/5 |
| 2002/0123009 A1* | 9/2002 | Schaper | 430/323 |
| 2002/0131040 A1* | 9/2002 | Niu et al | 356/237.5 |
| 2002/0150824 A1* | 10/2002 | Park | 430/5 |
| 2003/0044059 A1* | 3/2003 | Chang et al. | 382/149 |
| 2004/0063038 A1* | 4/2004 | Shin et al. | 430/311 |

OTHER PUBLICATIONS

Kornblit, A., et al, "Role of Etch Pattern Fidelity in the Printing of Optical Proximity Corrected Photomasks", J.Vac.Sci. Technol. B 13(6), Nov./Dec. 1995, pp. 2944-2948.*

* cited by examiner

*Primary Examiner*—George Fourson
(74) *Attorney, Agent, or Firm*—Duane Morris LLP

(57) ABSTRACT

A photolithography and etch process sequence includes a photomask having a pattern with compensation features that alleviate patterning variations due to the proximity effect and depth of focus concerns during photolithography. The compensation features may be disposed near isolated or outermost lines of a device pattern. A photoresist pattern is formed to include the compensation features and the pattern etched to form a corresponding etched pattern including the compensation features. After etching, a protection material is formed over the layer and a trim mask is used to form a further photoresist pattern over the protection material. A subsequent etching pattern etches the protection material and removes the compensation features and results in the device lines being formed unaffected by proximity effects. Flare dummies may additionally be added to the mask pattern to increase pattern density and assist in endpoint detection. Flare dummies, like the compensation features, are subsequently removed by a photolithography and etching process sequence.

17 Claims, 3 Drawing Sheets

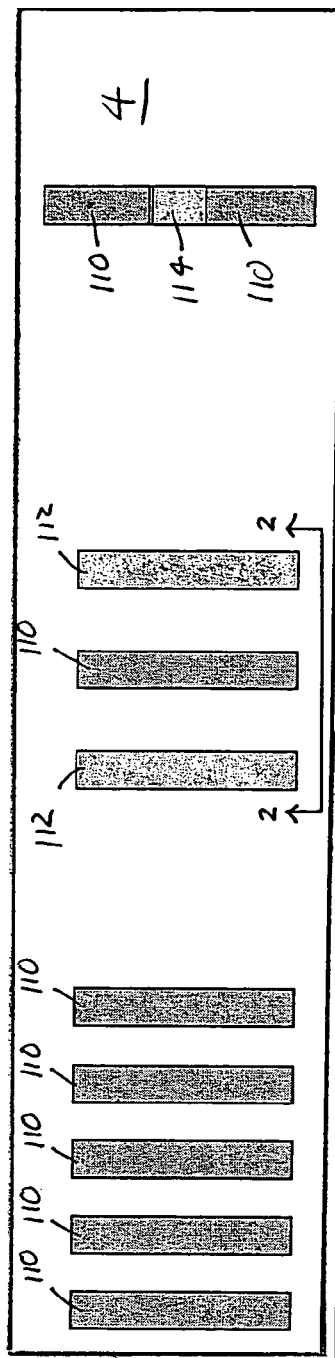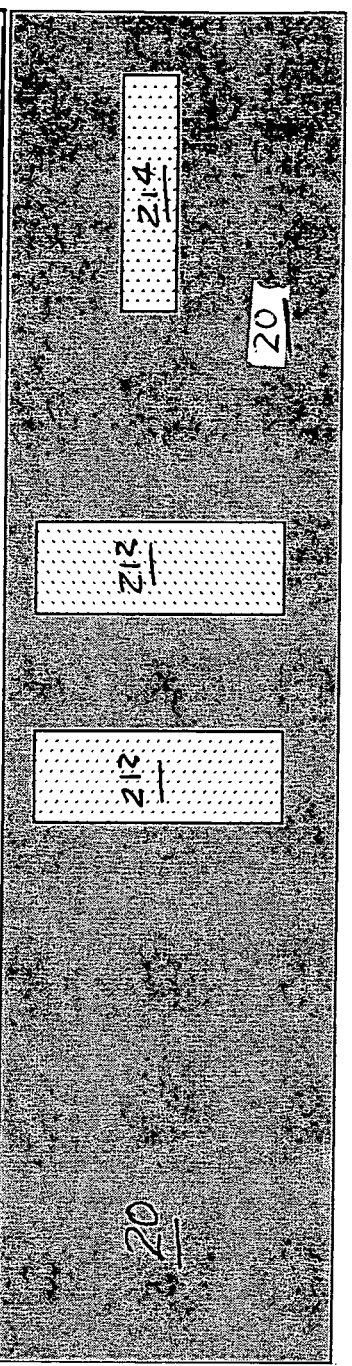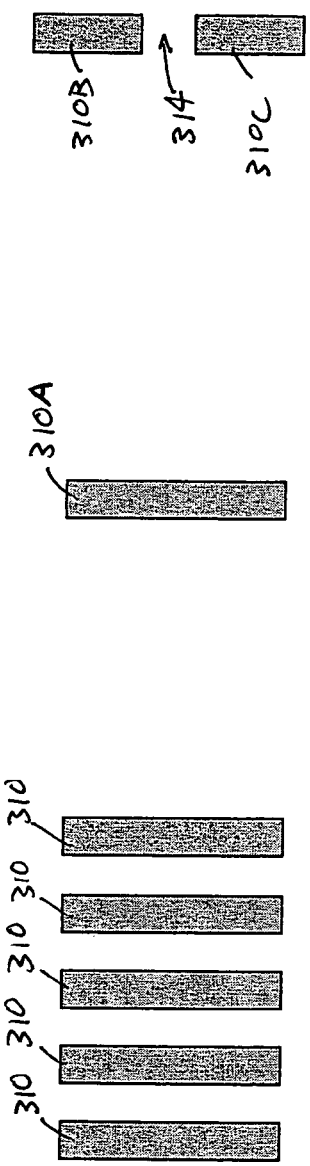
FIG. 1A
FIG. 1B
FIG. 1C

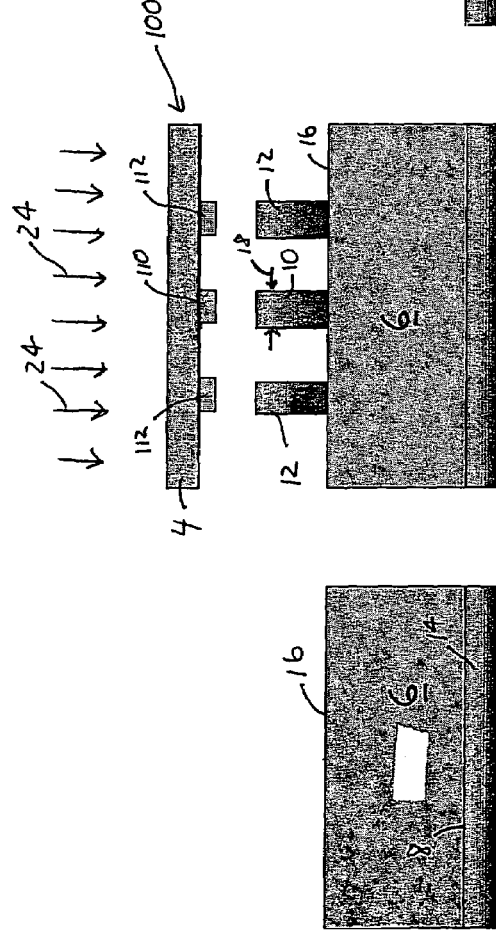
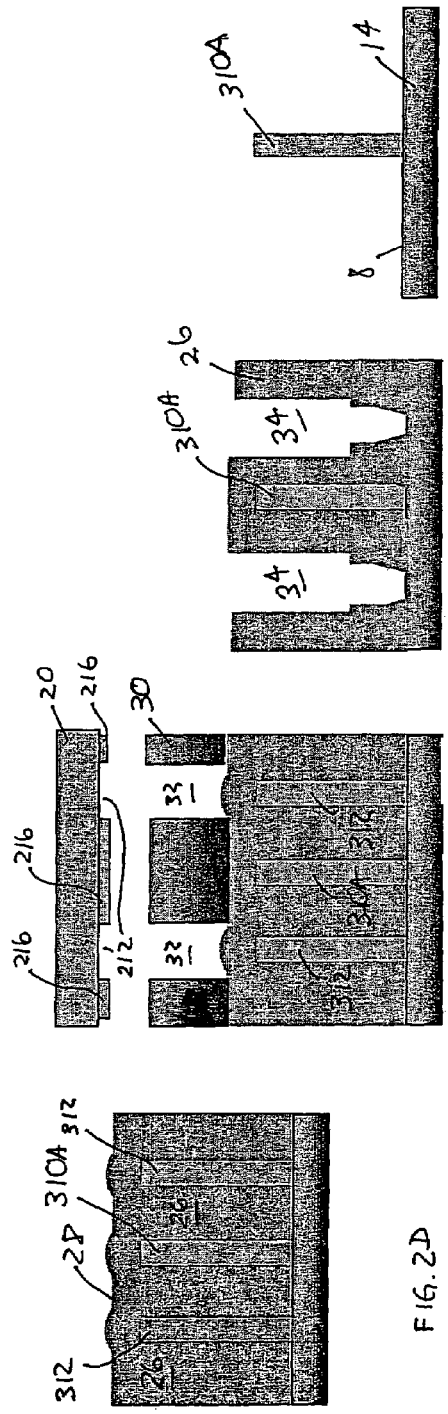

METHOD UTILIZING COMPENSATION FEATURES IN SEMICONDUCTOR PROCESSING

FIELD OF THE INVENTION

The present invention relates, most generally, to photolithography and etch processes in semiconductor device manufacturing. More particularly, the present invention relates to a method of improving CD uniformity and decreasing proximity effects and line end shortening in semiconductor device patterning.

BACKGROUND

In today's rapidly advancing semiconductor manufacturing industry, the demand for increasing levels of device integration requires that device features are made increasingly smaller and in closer proximity to one another. The most critical step in defining and ultimately producing device features are the photolithography and etching operations. As such, higher levels of device integration will likely be attained by technological advances in the photolithography and/or etch processes. In order to meet this demand, processes for increasing photomask resolution, such as the process of optical proximity correction (OPC), are put forward constantly.

The object of OPC is to eliminate the phenomenon of the proximity effect in photolithography. In metal-oxide-semiconductor (MOS) devices, each of several component layers, i.e., film layers and dopant levels, is patterned using a photolithography step. Photolithography entails coating a substrate, such as a semiconductor wafer, with a photosensitive film, commonly called photoresist, then exposing the photosensitive film by projecting light through a photomask that includes transparent areas and an opaque pattern. The photomask pattern is transferred to the photoresist layer producing a photoresist pattern which acts as a mask for subsequent doping or etching procedures.

A light beam that travels along the edge of an opaque feature produces a scattering phenomenon that enlarges the light beam. When the light beam passes through the photoresist layer on the substrate, it also reflects off the substructure beneath the photoresist layer and the phenomenon of interference results. As such, various phenomenon influence the projection of an opaque pattern from a photomask onto a photoresist layer. The smaller the critical dimension of the pattern features are, the more prominent these phenomenon become, especially when the critical dimension approaches half of the wavelength of the light source.

These exposure phenomenon combine to create the proximity effect which causes problems when isolated lines and nested, i.e., densely packed, lines undergo exposure at the same time. Isolated, or outermost lines in a photomask pattern lack an adjacent opaque scattering feature in the device pattern. The proximity effect causes isolated and nested lines which have the same dimensions in the opaque photomask pattern, to be formed to include different dimensions in the pattern formed in the photoresist material. Isolated (or outermost) lines and nested lines of the same mask dimension therefore require different exposure conditions to produce device features of the same dimension.

The use of scattering bars represents one OPC technique used to correct and reduce the proximity effect in the photolithography process and to correct for mask bias differences between nested and isolated lines. According to this technique, bar-like patterns are added to the photomask along the periphery of, and in close proximity to, actual device features that would not otherwise have an opaque scattering feature in the device pattern. When exposure occurs, the light wave passes the scattering bar and scatters so that the proximity effect is eliminated with respect to outermost or isolated device features. If the scattering bars are not wide enough, they do not sufficiently eliminate the proximity effect or compensate for depth of focus concerns that arise between features at different topographical levels of the device being exposed. Conversely, if the scattering bars are too wide, they undesirably cause a corresponding and undesirable pattern to be formed in the photoresist layer.

It would therefore be desirable to utilize scattering bars sufficiently large to mitigate the proximity effect and depth of focus issues, but which do not remain and cause unwanted pattern features in the layer being patterned.

SUMMARY OF THE INVENTION

To address these and other objects, and in view of its purposes, the present invention provides a method for mitigating depth of focus and proximity effects during photolithography and etch processes, thereby widening the process window for such photolithography processes.

In one embodiment, the invention provides a method for patterning a layer of a semiconductor device. The method includes forming a pattern in a photoresist layer by exposing a photomask pattern that includes a main structural feature and at least one compensation feature that compensates for proximity effects during exposure. The method further includes etching to form an etched pattern including a corresponding etched main structural feature and at least one corresponding etched compensation feature, in a film underlying the photoresist layer. The method further provides for removing the at least one etched compensation feature.

In another exemplary embodiment, the present invention provides a method for forming a pattern in a semiconductor device. The method includes providing a photomask having an opaque pattern including a main structural line and at least one compensation line disposed parallel to the main structural line. A photoresist layer is formed over a film layer formed on the substrate. The method further includes exposing and developing to form a photoresist pattern in the photoresist layer corresponding to the opaque pattern. Etching then produces an etched pattern corresponding to the photoresist pattern in the film, the etched pattern including the at least one compensation line. The photoresist pattern is removed and a protection material formed over the etched pattern. A further photoresist pattern is formed in a further photoresist layer over the protection material, the further photoresist pattern including void areas over the least one compensation line. An etching process is then carried out to etch the void areas thereby removing the protection material from these areas and the at least one compensation line.

BRIEF DESCRIPTION OF THE DRAWING

The present invention is best understood from the following detailed description when read in conjunction of the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing. Included in the drawing are the following figures.

FIG. 1A shows an exemplary first mask pattern and FIG. 1B shows an exemplary trim mask pattern used in conjunction with the first mask pattern shown in FIG. 1A to produce the device structure shown in FIG. 1C. Each of FIGS. 1A–1C are plan views.

FIGS. 2A–2G are cross-sectional views illustrating a sequence of process operations used to produce a device structural line according to the present invention.

DETAILED DESCRIPTION

Figure 3:
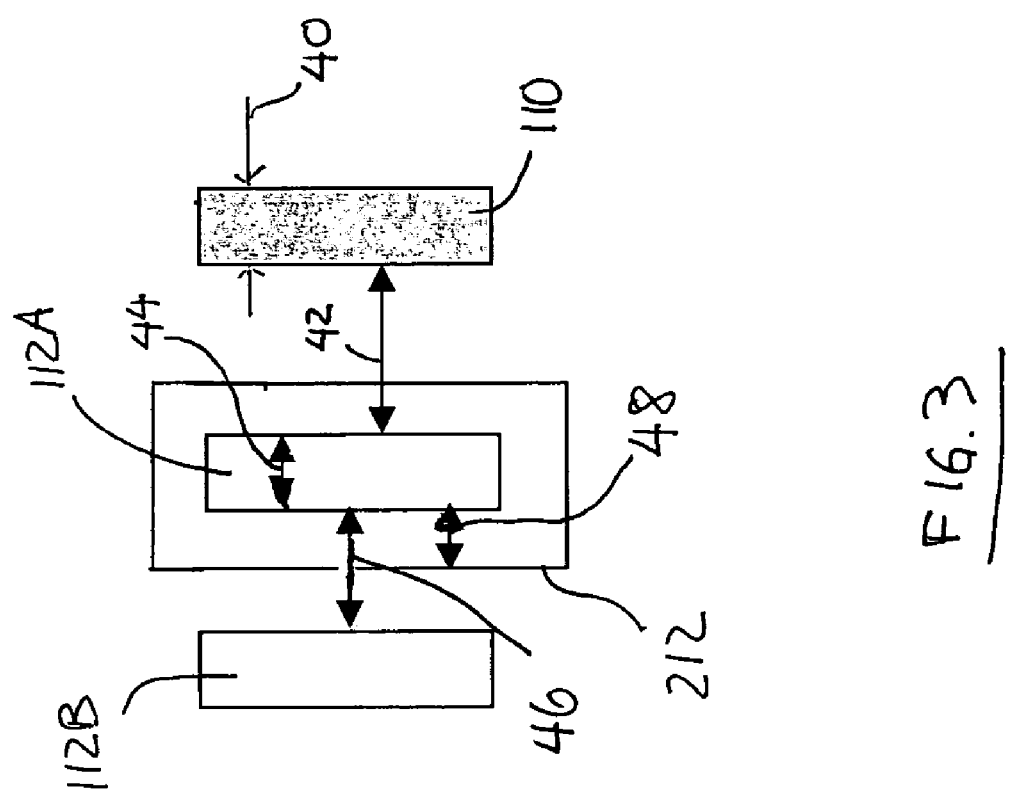
FIG. 3 is a plan view showing superimposed mask levels of the present invention.

The present invention overcomes the limitations of the prior art and provides compensation features such as scattering bars added to a photomask pattern. The compensation features are patterned and etched along with device features, then removed. The compensation features may be used at any of various mask levels and in conjunction with the production of various semiconductor devices. In one embodiment, the compensation features may be scattering bars used in conjunction with an isolated line or an outermost line of an array of lines. The compensation feature is sufficiently wide to improve the depth of focus for isolated or outermost lines of the desired pattern which are situated differently than otherwise similar nested lines. In an another embodiment, the compensation feature may be a line segment connecting two linearly aligned device features. When this exemplary compensation feature is removed, the facing end lines include superior pattern integrity. The method of the present invention does not require an exposure to be carried out with a photoresist pattern already in place and therefore device CD's are not subsequently compromised. The expression "device pattern" signifies actual device features in a photomask or as formed on the substrate, as opposed to the auxiliary compensation features of the invention used to enhance the integrity of the device pattern and which are later removed.

The present invention is applicable to mask levels used to pattern underlying films formed of various materials and thicknesses, and may be used in conjunction with various photoresist materials and various exposure tools such as projection printers and steppers. The present invention may also be used in conjunction with various light sources having various wavelengths.

FIGS. 1A–1C are generally horizontally aligned with respect to one another to indicate that if pattern 200 of trim mask 20 is horizontally aligned over pattern 100 of photomask 4, void areas 212 will be aligned over compensation lines 112 to ultimately result in the removal of these features as indicated in pattern 300. Pattern 300 includes device features 310 including device line 310A and device line segments 310B and 310C. Similarly, when void area 214 is aligned over compensation segment 114, space 314 will ultimately result between device line segments 310B and 310C, as will be explained. Compensation lines 112 and compensation segment 114 are compensation features that may take on other shapes in other embodiments.

FIG. 1A shows pattern 100 formed on photomask 4. Pattern 100 may be a pattern used to form any of various levels of a semiconductor device on any of various substrates and includes opaque features 110, 112 and 114 in an otherwise transparent field. Pattern 100 also represents the corresponding pattern formed in a photoresist layer from photomask 4, after expose and develop. Device lines 110 are opaque, typically chrome features used to form structural features in the actual semiconductor device and compensation lines 112 and compensation segment 114 are also opaque, typically chrome features used to increase the process window and provide pattern integrity in the device pattern. While these compensation features 112 and 114 are included in mask 4 and will be translated to corresponding photoresist and etched patterns, they will ultimately be removed, as will be shown in FIGS. 2A–2G.

The mask set shown in FIGS. 1A and 1B and used in combination to produce pattern 300 shown in FIG. 1C, is used with a positive photoresist in which transparent exposed areas are ultimately developed and etched away, and in which opaque features produce corresponding photoresist features and, ultimately, corresponding physical device features. The principles of the present invention also apply to negative photoresist systems in which the converse is true, i.e., light transmissive or void areas in the photomask which become exposed, remain after the develop process which develops away portions of the photoresist that correspond to the opaque pattern and which were not exposed. For simplicity, the previous and following discussions are in terms of positive photoresist, most favored in today's advanced photolithography processes.

FIGS. 2A–2G are cross-sectional views showing a process sequence used to form a main structural device line. FIG. 2A shows film layer 6 formed over surface 8 of substrate 14. Film layer 6 includes top surface 16. Film layer 6 may be any of various films used in the manufacture of semiconductor devices. For example, film layer 6 may be polysilicon, a polycide, a conductive layer formed of various materials, or any of various other layers used in the manufacture of semiconductor devices. In some exemplary embodiments, film layer 6 may be a composite of more than one film layer. Substrate 14 may be a wafer used in semiconductor manufacturing or it may be a further layer formed over the wafer.

FIG. 2B shows a portion of photomask 4 that generally corresponds to portion 2—2 shown in FIG. 1A. Photomask 4 includes device line 110 and compensation lines 112, each of which are opaque features. Opaque device line 110 is used to form a corresponding isolated main structural feature in the device level formed from film layer 6. Compensation lines 112 are parallel to, and in close proximity to, device line 110. FIG. 2B shows the structure after a photoresist layer was formed over surface 16 then patterned using photomask 4. The patterning involves exposure by light, indicated as arrows 24, then the subsequent developing of the exposed portions of the photoresist layer. Various light sources and wavelengths of light may be used. After patterning, i.e., after exposure and develop, a photoresist pattern is formed to include photoresist lines 10 and 12. The width, i.e., CD or critical dimension 18 of photoresist line 10 will similar to a corresponding critical dimension of a nested line formed elsewhere in the photoresist layer because compensation lines 112 compensate for proximity effects during the exposure process. Photoresist line 10 corresponds to opaque device line 110 of photomask 4 and represents a main structural feature of the semiconductor device. Photoresist lines 12 correspond to opaque compensation lines 112.

An etching procedure is carried out using the photoresist pattern as a mask and produces a corresponding etched pattern shown in FIG. 2C. Conventional etch processes are known for the various materials that may form film layer 6, and may be used. The etched pattern shown in FIG. 2C includes etched device line 310A and etched compensation lines 312. The etched compensation lines 312 correspond to photoresist lines 12 shown in FIG. 2B and opaque compensation lines 112 of photomask 4. Etched device line 310A corresponds to photoresist line 10 and opaque device line 110 shown in FIG. 2B. Etched device line 310A includes an etched CD 316 that is essentially the same as the corresponding critical dimension of a nested feature (not shown).

After etching and the subsequent removal of any residual photoresist materials, a protection material is formed over the etched pattern as shown in FIG. 2D. Protection material 26 may be formed by spin coating, chemical vapor deposition (CVD) or other suitable techniques. In one exemplary embodiment, protection material 26 may be an organic material such as another photoresist, BARC (bottom anti-reflective coating) a CVD organic ARC, or various other materials that are chosen in conjunction with a subsequent etching process to produce a high etch selectivity with respect to film layer 6. In one exemplary embodiment, protection material 26 may be substantially planarized such as by chemical mechanical polishing (CMP) or various etch-back procedures. In one particular exemplary embodiment (not shown), top surface 28 may be planarized essentially down to etched lines 310A and 312.

Trim mask 20 including trim pattern 200 is then used to produce a further photoresist pattern in further photoresist layer 30 formed over protection material 26 as shown in FIG. 2E. Trim mask 20 includes opaque areas 216 and void areas 212 which are light transmissive areas aligned over etched compensation lines 312. An expose and develop process sequence is used to form openings 32 in further photoresist layer 30, openings 32 corresponding to void areas 212. Openings 32 are aligned over etched compensation lines 312.

An etching process is then used to etch the areas corresponding to openings 32 and void areas 212 and to produce the structure shown in FIG. 2F. The etching process etches exposed portions of protection material 26 and etched compensation lines 312 to produce openings 34. The high [film layer 6:protection material 28] etch selectivity enables compensation line 312 to be completely removed by the etching process. The etched, main device line 310A remains intact. Various methods are then used to selectively remove protection material 26 to leave etched device line 310A as shown in FIG. 2G. Because compensation lines 312 are ultimately removed using a process that does not compromise the integrity of device line 310A, the widths of compensation lines 112 of photomask 4 need not be restricted. As such, full-size compensation lines 112, also called scatter bars, may be used. Compensation lines 112 may include the same width as opaque line 110 shown in FIG. 2B. This is discussed further in conjunction with FIG. 3.

Although the cross-sectional views illustrated in FIGS. 2A–2G correspond generally to the central device line 110 flanked by compensation lines 112 of FIG. 1A, it should be understood that the structure shown on the right-hand side of FIG. 1A, namely the two linearly aligned device lines 110 with compensation segment 114 therebetween, undergoes the same sequence of processing operations to produce the structure shown in the right hand side of pattern 300 of FIG. 1C, namely, etched device line segments 310B and 310C spaced apart by space 314. After a photoresist line and corresponding etched line are formed to correspond to the composite structure of device line segments 110 and line segment 114 shown in FIG. 1A, void area 214 of trim mask 20 is used to form a void in a photoresist pattern over compensation segment 114. An etching process is then used to produce the etched structure including segments 310B and 310C spaced apart by space 314, corresponding to opaque compensation segment 114. The facing ends of lines 310B and 310C are not defined or adversely affected by the photolithography process and therefore exhibit superior pattern integrity.

In another exemplary embodiment, the mask pattern such as pattern 100 shown in FIG. 1A may additionally include flare dummies disposed throughout the mask level. Flare dummies are opaque features added to the mask level to increase pattern density and therefore assist in automatic endpoint detection. Flare dummies are generally disposed in mask areas lacking other opaque features. Flare dummies are therefore not proximate to active device features. Like compensation lines 112 and compensation segment 114, the flare dummies will also be etched, then removed in a subsequent photolithography and etching operation such as used in the removal of compensation lines 312 shown in FIGS. 2D–2G. Flare dummies may be present in addition to compensation structures and will therefore be removed in the same subsequent etching operation used to remove the compensation features, after patterning with the trim mask.

FIG. 3 shows various critical dimensions associated with the compensation lines with respect to the device pattern of mask pattern 100 and also with respect to aspects of pattern 200 of the trim mask. FIG. 3 shows opaque main device line 110 and opaque compensation lines 112A and 112B, each of which are in close proximity and substantially parallel to, device line 110. Main device line 110 and compensation lines 112A and 112B are part of the same mask pattern such as mask pattern 100 shown in FIGS. 1A and 2B, though compensation lines 112A and 112B are situated differently in the exemplary embodiment illustrated in FIG. 3, to illustrate various dimensional relationships. FIG. 3 also shows transmissive void area 212 of the trim mask 20 shown in FIGS. 1B and 2E, aligned over proximate compensation line 112A. It should be understood that a similar void area 212 will be aligned over compensation line 112B but is omitted from FIG. 3 to illustrate various dimensional relationships.

Opaque device line 110 includes a critical dimension width 40 which may be the minimum critical dimension at the particular device level. The minimum CD may vary depend on device level, design rules, and the level of integration of the device being formed. Opaque device line 110 is spaced by distance 42 from the most proximate compensation line 112A which includes a critical dimension, width 44. In one embodiment, distance 42 is the same or greater than the minimum spacing between adjacent device lines. In another exemplary embodiment, distance 42 is equal to or greater than the minimum spacing of the device pattern. Width 44 of compensation line 112A may be at least one half times width 40 of opaque device line 110 and in one embodiment may be 0.7 times width 40. As such, compensation lines 112 may include a width 44 as great as width 40 of main device line 110. In one embodiment, width 44 may be within +/− 40 nanometers of width 40. Compensation lines 112 may completely mitigate proximity effects and depth of focus concerns between isolated and densely packed lines during the photolithography and etch processes because an outermost or isolated device line having such a compensation line disposed parallel and in close proximity to the device line is essentially in the same device neighborhood as a nested line formed in a dense pattern area. Adjacent compensation lines 112A and 112B are spaced from each other by distance 46 and void area 212 overhangs compensation line 112A on each side by gap 48. Distance 46 may be equal to or greater than the minimum spacing between adjacent devices lines in the device pattern. The trim space, gap 48, is chosen to sufficiently expose the area over etched compensation lines 312 and is typically designed with respect to the dimensions of opaque compensation lines 112. In one exemplary embodiment, gap 48 may be equal to 2× the root mean square sum of stage accuracy and the mask overlay error for the mask alignment and projection system. Other distances may be used for gap 48 in other exemplary embodiments.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical,", "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for patterning a layer of a semiconductor device, said method comprising:
    forming a pattern in a photoresist layer by exposing a photomask pattern including a main structural feature and at least one compensation feature that compensates for proximity effects during said exposing;
    etching to form an etched pattern including a corresponding etched main structural feature and at least one corresponding etched compensation feature, in a film layer underlying said photoresist layer;
    forming a protection material over said etched pattern; and
    further etching using a single etch process that removes portions of said protection material said at least one etched compensation feature.

2. The method as in claim 1, wherein said forming a pattern in a photoresist layer includes forming said photoresist layer over said film layer, providing a photomask in which said main structural feature and said at least one compensation feature are opaque features thereof, and developing after said exposing.

3. The method as in claim 1,
    forming a protection material over said etched pattern;
    further comprising forming a further photoresist pattern in a further photoresist layer formed over said protection material, said further photoresist pattern including a corresponding void area aligned over each of said at least one etched compensation feature; and
    wherein said further etching comprises etching each said void area to remove said portions of said protection material and said at least one etched compensation feature.

4. The method as in claim 1, wherein said protection material includes an etch rate less than an etch rate of said film layer, during said further etching.

5. The method as in claim 1, wherein said forming a protection material comprises forming a BARC coating.

6. The method as in claim 1, wherein said forming a protection material comprises one of spin coating and CVD.

7. The method as in claim 1, wherein said at least one compensation feature includes a line having a line width and said corresponding void area aligned over said line, includes a void width being greater than said line width.

8. The method as in claim 1, further comprising planarizing said protection material prior to said further etching.

9. The method as in claim 8, wherein said planarizing comprises one of CMP and an etch-back operation.

10. The method as in claim 1, wherein said main structural feature is a device line and said at least one compensation feature includes a compensation line in close proximity and substantially parallel to said device line.

11. The method as in claim 10, wherein said device line includes a width and said compensation line has a width within +/− 40 nanometers of said width.

12. The method as in claim 10, wherein said device line includes a critical dimension width of x nanometers and said compensation line has a width greater than 0.5x nanometers.

13. The method as in claim 10, wherein said compensation line is spaced from said device line by a distance which is at least as great as a minimum dimension of a device pattern.

14. The method as in claim 10, wherein said compensation line is spaced from said device line by at least a distance equal to a minimum spacing between adjacent device lines.

15. A method for patterning a layer of a semiconductor device, said method comprising:
    forming a pattern in a photoresist layer by exposing a photomask pattern including a main structural feature and at least one compensation feature that compensates for proximity effects during said exposing;
    etching to form an etched pattern including a corresponding etched main structural feature and at least one corresponding etched compensation feature, in a film layer underlying said photoresist layer; and
    removing said at least one etched compensation feature, wherein said main structural feature comprises a device line aligned substantially linearly with respect to a further structural line and said at least one compensation feature includes a line segment connecting said device line and said further structural line.

16. The method as in claim 1, further comprising said photomask further including removable features that increase pattern density and simplify endpoint detection and wherein said etching includes said etched pattern including corresponding etched removable features and said removing includes removing said removable features.

17. A method for forming a pattern in a layer of a semiconductor device, comprising:

providing a photomask having a pattern including a main structural line and at least one compensation line disposed parallel to said main structural line;

forming a photoresist layer over a film layer formed on a substrate;

exposing and developing to form a photoresist pattern in said photoresist layer corresponding to said pattern;

etching to form an etched pattern corresponding to said photoresist pattern in said film layer, said etched pattern including said at least one compensation line disposed parallel to said main structural line;

removing said photoresist pattern;

forming a protection material over said etched pattern;

forming a further photoresist pattern in a further photoresist layer over said protection material, said further photoresist pattern including void areas over said at least one compensation line; and etching in said void areas to remove both said protection material and said at least one compensation line using a single etching process that etches said film layer faster than said protection material.

* * * * *

UNITED STATES PATENT AND TRADEMARK OFFICE
CERTIFICATE OF CORRECTION

| | | |
|---|---|---|
| PATENT NO. | : 7,202,148 B2 | Page 1 of 1 |
| APPLICATION NO. | : 10/842065 | |
| DATED | : April 10, 2007 | |
| INVENTOR(S) | : Kuei Shun Chen, Chin-Hsiang Lin and Chih-Cheng Chiu | |

It is certified that error appears in the above-identified patent and that said Letters Patent is hereby corrected as shown below:

Column 7, line 58, after "material" insert -- and --.

Column 10, line 1, delete "pattern:" and insert therefore -- pattern; --.

Signed and Sealed this

Fourth Day of September, 2007

JON W. DUDAS
*Director of the United States Patent and Trademark Office*